US006777661B2

(12) United States Patent
Summa et al.

(10) Patent No.: US 6,777,661 B2
(45) Date of Patent: Aug. 17, 2004

(54) INTERLINED CHARGE-COUPLED DEVICE HAVING AN EXTENDED DYNAMIC RANGE

(75) Inventors: Joseph R. Summa, Hilton, NY (US); Christopher Parks, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 8 days.

(21) Appl. No.: 10/098,859

(22) Filed: Mar. 15, 2002

(65) Prior Publication Data

US 2003/0173497 A1 Sep. 18, 2003

(51) Int. Cl.[7] .............................................. H01L 27/00
(52) U.S. Cl. ..................... 250/208.1; 348/322; 257/232
(58) Field of Search .......................... 250/208.1, 214 R, 250/214.1; 348/322, 323, 316, 311; 257/232, 233, 222, E27.15, E27.151, E27.156, E27.159; 396/113

(56) References Cited

U.S. PATENT DOCUMENTS 5,844,290 A * 12/1998 Furumiya ................... 257/432
6,040,591 A * 3/2000 Otsuka ....................... 257/232
6,360,059 B1 * 3/2002 Ide et al. .................... 396/114
6,433,326 B1 * 8/2002 Levine et al. ............. 250/208.1

* cited by examiner

Primary Examiner—Thanh X. Luu
Assistant Examiner—Seung C. Sohn
(74) Attorney, Agent, or Firm—Peyton C. Watkins

(57) ABSTRACT

An image sensor includes (a) a plurality of pixels each having (i) a plurality of photosensitive areas having a first sensitivity to light for forming a first sensitivity area; (ii) a plurality of charge-coupled devices respectively adjacent the photosensitive areas having a second sensitivity to light for forming a second sensitivity area; wherein the second sensitivity area is less sensitive to light than the first sensitivity area so that the second sensitivity area saturates after the first sensitivity area saturates; (iii) a first transfer mechanism for permitting electrons to be passed from the first sensitivity area to the second sensitivity area; and (b) a second transfer mechanism for moving electrons through the plurality of charge-coupled devices.

6 Claims, 2 Drawing Sheets

INTERLINED CHARGE-COUPLED DEVICE HAVING AN EXTENDED DYNAMIC RANGE

FIELD OF THE INVENTION

This invention relates generally to the field of image sensors and, more particularly to, such image sensors having vertical charge-coupled devices that capture high light levels and photodiodes that capture low light levels for extending the dynamic range of the image sensor.

BACKGROUND OF THE INVENTION

A typical interlined charge-coupled device includes a plurality of photosensitive areas for capturing incident light and generating electrons representative of the captured image. The charge-coupled device also includes a plurality of charge-coupled devices disposed respectively adjacent the photosensitive areas for receiving electrons generated from the photosensitive areas and for transporting the electrons to other circuitry, as is well known in the art. A plurality of metal shield respectively covers the plurality of charge-coupled devices for preventing the incident light from exposing them.

Although the presently known and utilized interlined CCD is satisfactory, improvements are always desirable. In this regard, it is sometimes desirable to capture high levels of light that are lost when photosensitive areas become saturated.

Consequently, a need exists for an interlined CCD that includes the above-described improvement.

SUMMARY OF THE INVENTION

The present invention is directed to overcoming one or more of the problems set forth above. Briefly summarized, according to one aspect of the present invention, the invention resides in an image sensor having a plurality of pixels each including a plurality of photosensitive areas having a first sensitivity to light for forming a first sensitivity area, a plurality of charge-coupled devices respectively adjacent the photosensitive areas having a second sensitivity to light for forming a second sensitivity area; wherein the second sensitivity area is less sensitive to light than the first sensitivity area so that the second sensitivity area saturates after the first sensitivity area saturates, and a first transfer mechanism for permitting electrons to be passed from the first sensitivity area to the second sensitivity area; and the image sensor also including a second transfer mechanism for moving electrons through the plurality of charge-coupled devices.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the following advantage of capturing high levels of light by the charge-coupled devices for extending the dynamic range of the image sensor.

DETAILED DESCRIPTION OF THE INVENTION

Figure 1:
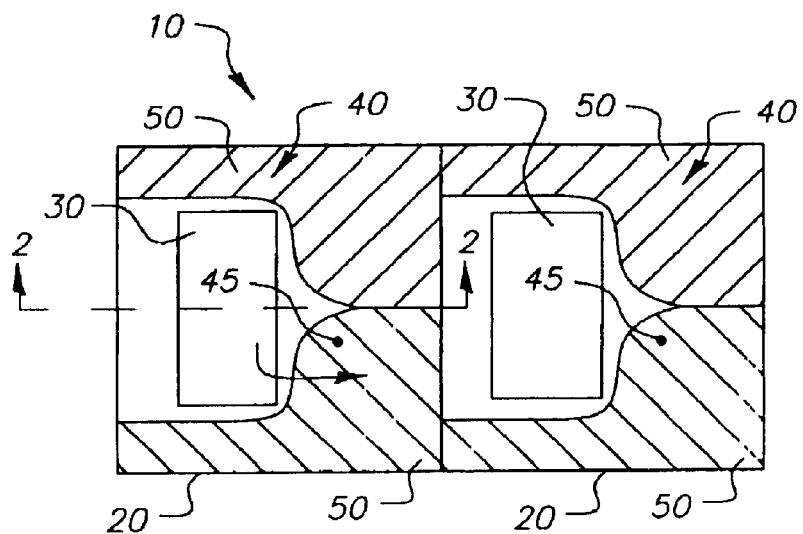
FIG. 1 is a top view of the interlined CCD of the present invention with a top portion (micro-lenses and a color filter array) not shown for clarity.
Figure 2:
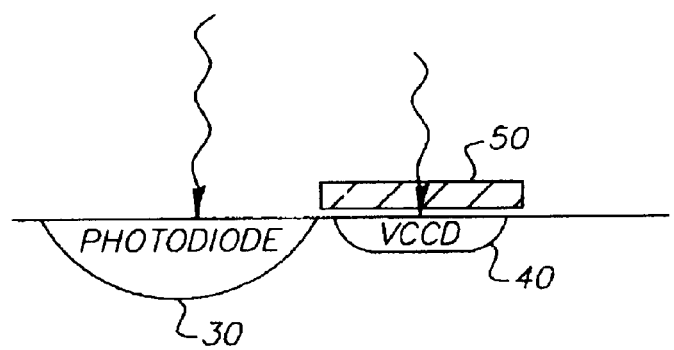
FIG. 2 is a view in horizontal cross section of FIG. 1.

Referring to FIGS. 1 and 2, there is shown a top view of a portion of an interlined charge-coupled device (CCD) 10 of the present invention. The interlined CCD 10 includes a plurality of pixels 20 each having a photodiode 30 for collecting incident light that is converted into electrons representative of the captured image. Each pixel 20 also includes a plurality of vertical CCDs 40 that are respectively disposed adjacent the photodiodes 30 for receiving the electrons from the photodiodes 30 and for transporting the electrons to other well-known circuitry. A transfer gate 45 transfers the electrons from the photodiode 30 to the vertical charge-coupled devices 40.

In the case of a two-phase CCD, two gates 50 are positioned substantially covering the vertical CCDs 40 that are clocked in a pre-determined sequence for transporting the electrons therein to other well-known circuitry. It is understood by those skilled in the art that more than two gates 50 may be used for other designs as is well known in the art.

Figure 3:
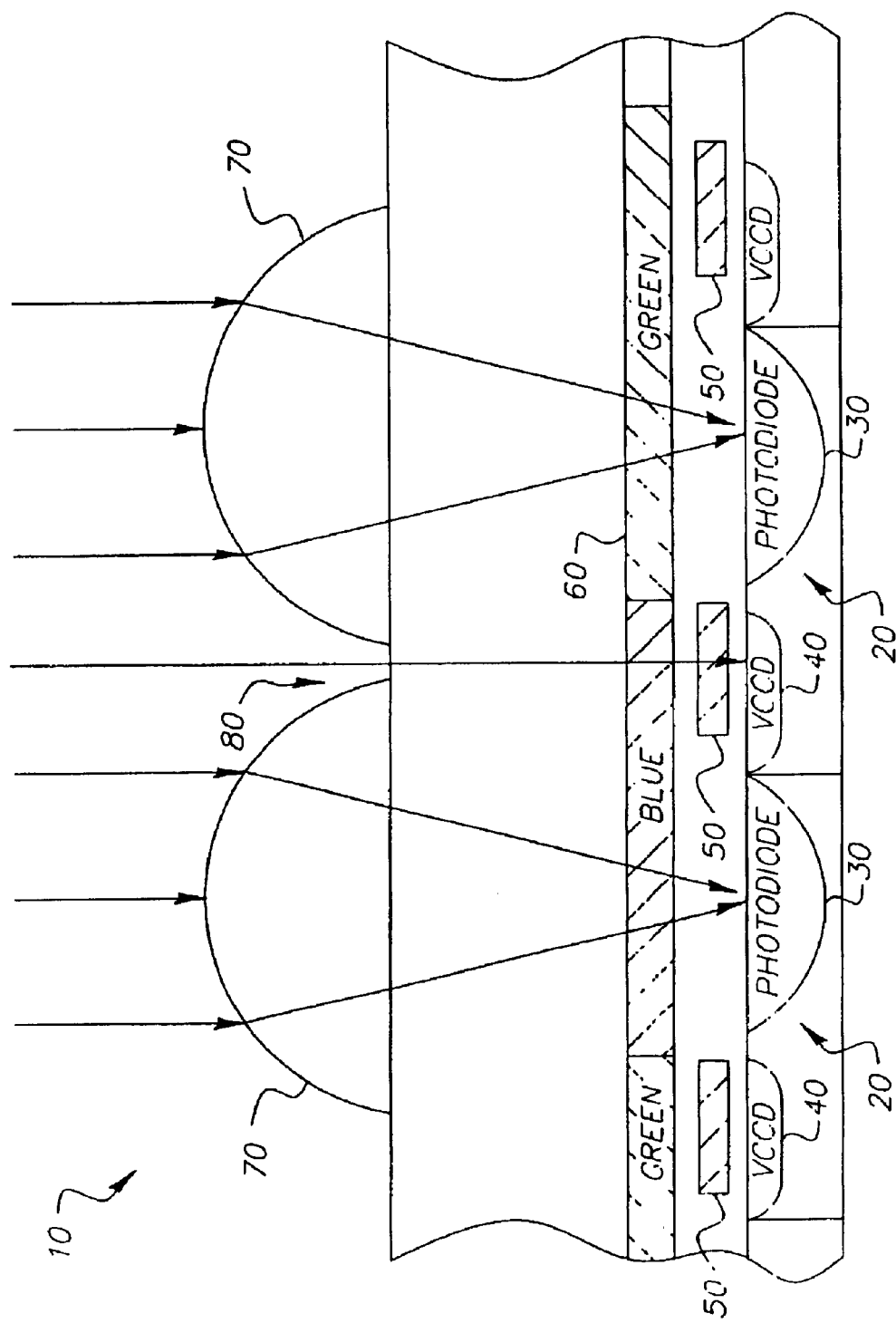
FIG. 3 is a view in horizontal cross section illustrating both the interlined CCD and the top portion (micro-lenses and a color filter array)

Referring to FIG. 3, there is shown the interlined CCD 10 of the present invention including various components not shown in FIGS. 1 and 2. In this regard, a color filter array 60 is positioned over the pixels 20 for providing various color content to the photodiodes 30 according to the filter through which the light passes. For example, in a Bayer pattern, the array 60 has a pre-determined pattern and color content, red, green and blue (RGB). A plurality of micro-lenses 70 is respectively positioned in a predetermined alignment to the photodiodes 30 for focusing the incident light onto their respective photodiodes 30. Due to manufacturing limitations, a gap 80 inevitably occurs between the micro-lenses 70. This light not captured by the micro-lens 70 is passed through the gap 80, a color filter 60, a gate 50, and eventually to the respective vertical CCD 40. The CCD 40 does not saturate as fast as the adjacent photodiode 30, and as a result, the CCD 40 captures the high light level and the photodiode 30 captures the low light level. The charge collected in the CCD 40 is read out prior to transferring the collected charge in the photodiode 30 to the CCD 40 that is also subsequently readout.

By reading out the charge collected in the vertical CCD 40 prior to transferring from the photodiode 30 into the vertical CCD 40, two pieces of information can be obtained for each pixel. Since the vertical CCD 40 receives only a fraction of the available light, the vertical CCD 40 can be used to recover "high light" information beyond the point where the neighboring photodiodes 30 are saturated which effectively extends the dynamic range of the device.

Figure 4:
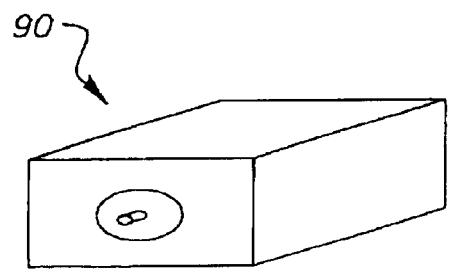
FIG. 4 is an image capture device in which the interlined CCD may be used.

Referring to FIG. 4, the above-described interlined CCD 10 may be used in any suitable image capture device 90, such as, but not limited to, a digital camera and the like.

The invention has been described with reference to a preferred embodiment. However, it will be appreciated that variations and modifications can be effected by a person of ordinary skill in the art without departing from the scope of the invention.

Parts List 10 interlined CCD
20 pixel
30 photodiode

40 vertical CCD
50 gates
60 color filter array
70 micro-lens
80 gap
90 image capture device

What is claimed is:

1. An image sensor comprising:
   (a) a plurality of pixels each comprising:
      (a1) a plurality of photosensitive areas having a first sensitivity to light for forming a first sensitivity area;
      (a2) a plurality of charge-coupled devices respectively adjacent the photosensitive areas having a second sensitivity to light for forming a second sensitivity area; wherein the second sensitivity area receives light that passes substantially uninhibited to the second sensitivity area and is less sensitive to light than the first sensitivity area so that the second sensitivity area saturates after the first sensitivity area saturates;
      (a3) a first transfer mechanism for permitting electrons to be passed from the first sensitivity area to the second sensitivity area; and
   (b) a second transfer mechanism for moving electrons through the plurality of charge-coupled devices.

2. The image sensor as in claim 1 further comprising a plurality of micro-lenses placed such that the primary focus is on the first sensitivity area, and a region between the micro-lenses is not shielded by a light shield and is over the second sensitivity area so that light not focused by the lens is passed substantially uninhibited to the second sensitivity area.

3. The image sensor as in claim 1, wherein after the pixels are exposed to light for capturing an image, the electrons are transferred out of the second sensitivity area, and then the electrons in the first sensitivity area are transferred from the first sensitivity area to the second sensitivity area and eventually out of the second sensitivity area thus producing two versions of the image in which the second sensitivity area contains high light levels and the first sensitivity area contains low light levels.

4. An image capture device for capturing an image comprising:
   (a) an image sensor comprising:
      (a1) a plurality of pixels each comprising:
         (i) a plurality of photosensitive areas having a first sensitivity to light for forming a first sensitivity area;
         (ii) a plurality of charge-coupled devices respectively adjacent the photosensitive areas having a second sensitivity to light for forming a second sensitivity area; wherein the second sensitivity area receives light that passes substantially uninhibited to the second sensitivity area and is less sensitive to light than the first sensitivity area so that the second sensitivity area saturates after the first sensitivity area saturates;
         (iii) a first transfer mechanism for permitting electrons to be passed from the first sensitivity area to the second sensitivity area; and
      (a2) a second transfer mechanism for moving electrons through the plurality of charge-coupled devices.

5. The image capture device as in claim 4 further comprising a plurality of micro-lenses placed such that the primary focus is on the first sensitivity area, and a region between the micro-lenses is not shielded by a light shield and is over the second sensitivity area so that light not focused by the lens is passed substantially uninhibited to the second sensitivity area.

6. The image capture device as in claim 4, wherein after the pixels are exposed to light for capturing an image, the electrons are transferred out of the second sensitivity area, and then the electrons in the first sensitivity area are transferred from the first sensitivity area to the second sensitivity area and eventually out of the second sensitivity area thus producing two versions of the image in which the second sensitivity area contains high light levels and the first sensitivity area contains low light levels.

* * * * *